United States Patent
Lin

(10) Patent No.: US 6,255,161 B1
(45) Date of Patent: Jul. 3, 2001

(54) METHOD OF FORMING A CAPACITOR AND A CONTACT PLUG

(75) Inventor: Wei-Ray Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 28 days.

(21) Appl. No.: 09/680,668

(22) Filed: Oct. 6, 2000

(51) Int. Cl.$^7$ .................. H01L 21/8242; H01L 21/4763
(52) U.S. Cl. .................. 438/254; 438/256; 438/396; 438/637; 438/639
(58) Field of Search .................. 438/239, 254, 438/255, 256, 396, 397, 595, 596, 637, 639; 257/306, 296, 308, 754, 755, 756

(56) References Cited

U.S. PATENT DOCUMENTS

| | | | |
|---|---|---|---|
| 5,712,813 | * 1/1998 | Zhang | 365/149 |
| 5,780,339 | * 7/1998 | Liu et al. | 438/253 |
| 5,953,609 | * 9/1999 | Koyama | 438/253 |
| 6,008,084 | * 12/1999 | Sung | 438/241 |
| 6,071,773 | * 6/2000 | Lee et al. | 438/253 |
| 6,071,789 | * 6/2000 | Yang et al. | 438/396 |
| 6,080,664 | * 6/2000 | Huang et al. | 438/638 |
| 6,097,055 | * 8/2000 | Lee et al. | 257/309 |
| 6,100,137 | * 8/2000 | Chen et al. | 438/253 |
| 6,137,130 | * 10/2000 | Sung | 257/306 |
| 6,143,617 | * 11/2000 | Shu et al. | 438/396 |
| 6,168,984 | * 1/2001 | Yoo et al. | 438/239 |
| 6,172,389 | * 1/2001 | Sakoh | 257/296 |

* cited by examiner

Primary Examiner—Michael Lebentritt
(74) Attorney, Agent, or Firm—Darby & Darby

(57) ABSTRACT

A method divides the formation of the contact plug connecting a source/drain region in the peripheral circuit area into two steps, wherein the capacitor can be fabricated at the same time so as to save one mask. Besides, at each step of forming the contact plug with low aspect ratio, a CVD method is utilized to uniformly deposited a barrier layer on the contact window and completely fill the contact window. This can thoroughly eliminate the defects found in the prior art. Consequently, the simplified process can reduce the manufacturing period time and the production cost.

22 Claims, 10 Drawing Sheets

US 6,255,161 B1

METHOD OF FORMING A CAPACITOR AND A CONTACT PLUG

BACKGROUND OF THE INVENTION

1. Field of the Invention

The present invention relates to a method of forming a capacitor and a contact plug, and more particularly, to a method of forming a capacitor and a contact plug at the same step.

2. Description of the Prior Art

A typical dynamic random access memory (DRAM) cell comprises a metal-oxide-semiconductor field effect transistor (FET) and a capacitor formed on a silicon semiconductor substrate, which makes the source of the FET electrically connect the charge-storage electrode plate of the capacitor. A DRAM is completed by gathering a plurality of the memory cells to form a memory cell array and is operated in accordance with peripheral circuits such as sensitive amplifiers.

By request of increasing the integration of DRAM in recent years, the area of the memory cell is reduced and thereby the size of the FET and capacitor should be lessened. In order to keep the capacitance appropriate in the narrow memory cell, it merely can develop the capacitor upwardly and which causes an upward movement of a metallic-conducting layer that simultaneously connects the upper electrode plate and a source/drain region of the peripheral circuits. Since this design would not lengthen the distance between the upper electrode plate and the metallic-conducting layer, it will not increase the difficulty in an etching process for forming a contact plug that provides the connection between the upper electrode plate and the metallic-conducting layer. However, this design would greatly lengthen the distance between the source/drain region of the peripheral circuits and the metallic-conducting layer, thereby another contact plug with greater aspect ratio formed by complicated process with two masks is needed for connecting the source/drain region and the metallic-conducting layer.

Please refer to FIG. 1A to FIG. 1G, FIG. 1A to FIG. 1G are schematic cross-sectional diagrams of forming a crown-shaped capacitor and a contact plug according to the prior art. As shown in FIG. 1A, a thermal oxidation process, such as local oxidation (LOCOS), is firstly performed on a p-type silicon substrate 100 to form a field-insulating layer (not shown) for isolating an active area. The active region comprises a memory cell area 102 and a peripheral circuit area 104. Next, conventional semiconductor processes, such as deposition, photolithography and ion-implantation, are performed on the active region in sequence to form a transistor (not shown), a bit line 112, a first contact plug 115, and a first insulating layer 120. The transistor has a gate and a diffusion region. The gate comprises a doped polysilicon layer and a silicide layer. The diffusion region comprises a first source/drain region 110 in the memory cell area 102, and a second source/drain region 111 in the peripheral circuit area 104. The bit line 112 formed of tungsten is connected with other memory cell. The first contact plug 115 is connected with the second source/drain region 111. Then, a second contact plug 118 formed of doped polysilicon is fabricated in the memory cell area 102 for connecting the first source/drain region 110. Then, a second insulating layer 122 formed of BPSG is deposited to cover the first insulating layer 120 and followed by a planarization process. Next, in a photolithography process, a photo resist layer (not shown) is coated and patterned on the second insulating layer 120, and then an etching process is performed to form a first opening 150 that passes through the second insulating layer 122 till exposing the top surface of the second contact plug 118. The photoresist layer is then removed.

As shown in FIG. 1B, a first conducting layer 142 is deposited on the second insulating layer 122 and the sidewall and bottom of the first opening 150 to connect the second contact plug 118. The first conducting layer 142 formed of tungsten.

As shown in FIG. 1C, another photoresist layer (not shown) is coated on the first conducting layer 142 and filling the first opening 150, and then a chemical mechanical polishing (CMP) method is used to remove the photoresist layer and the first conducting layer 142 positioned on the second insulating layer 122 except the portion those positioned in the first opening 150. Next, the photoresist layer remaining in the first opening 150 is removed and the first conducting layer 142' remaining in the first opening 150 is kept.

As shown in FIG. 1D, the second insulating layer 122 is patterned by a photolithography process and then partial of the second insulating layer 122 positioned on the first insulating layer 120 in the memory cell area 102 is etched away to expose the remaining first conducting layer 142'. The part 142' serves as a bottom electrode plate 170 of the crown-shaped capacitor.

As shown in FIG. 1E, a dielectric layer 175 is deposited on the surface of the bottom electrode plate 170, the second insulating layer 122 and the first insulating layer 120. Next, a second conducting layer 180 is deposited on the dielectric layer 175 to form an upper electrode plate 180 of the crown-shaped capacitor. This completed the crown-shaped capacitor in the memory cell area 102. Then, the dielectric layer 175 and the second conducting layer 180 positioned in the peripheral circuit area 104 is patterned and etched away.

As shown in FIG. 1F, a third insulating layer 124 formed of BPSG is deposited to cover the second insulating layer and the upper electrode plate 180, and then a planarization process is performed. Next, the third insulating layer 124 is patterned and etched to form a first contact window 152 passing through the third insulating layer 124 till exposing the upper electrode plate 180.

As shown in FIG. 1G, a photolithography is performed to pattern a second contact window 154 that passes through the third insulating layer 124, the second insulating layer 122 and partial of the first insulating layer 120 till exposing the top surface of first contact plug 115. However, at this step of forming the second contact window 154 having a great depth, it is difficult to control an etching stop and thus causes an incomplete etching. This will result in defects and a short circuit. A shielding layer 160 is deposited afterward by a physical vapor deposition (PVD) method to cover the surface of the third insulating layer 124, the first contact window 152 and the second contact window 154. Finally, a third conducting layer 144 is deposited on the shielding layer 160 by the PVD method to fill the first contact window 152 and the second contact window 154. The third conducting layer 144 in the first contact window 152 is used as a contact plug 184 for connecting the third conducting layer 144 and the upper electrode plate 180. The third conducting layer 144 in the second contact window 154 is used as a contact plug 185 for connecting the third conducting layer 144 and the second source/drain region 111.

From the above-mentioned process, some shortcomings are found as described hereinafter. First, two masks operated in accordance with two etching steps are needed after completing the capacitor in the memory cell area 102. One mask is used to form the first contact window 152 for connecting the third conducting layer 144 and the upper electrode plate 180. Since the upper electrode plate 180 is close to the third conducting layer 144, this etching step is easily controlled. The other mask is used to form the second contact window 154 for connecting the third conducting layer 144 and the first contact plug 115 in the peripheral circuit area 104. Since a request of reducing the volume of the DRAM cell is demanded, the capacitor is developed upward to match each reduced element. Nevertheless, this increases the distance between the third conducting layer 144 and the source/drain region 111, and thereby the second contact window 154 with high aspect ratio is designed. Since the etching stop is hard to be controlled, it is very difficult in forming the deep and narrow contact window by only one etching step. Also, the incomplete etching is often found to cause a short circuit and thus will deprive the expected functions of the semiconductor device.

Second, the designed distance between the third conducting layer 144 and the source/drain region 111 is long, it is not easy to uniformly deposited the shielding layer 160 on the sidewall and bottom of the second contact window 154 by the PVD method. The uneven shielding layer 160 will make the contact plug 185 bring about spiking, electro-migration and short circuit. Also, it is hard to completely fill the second contact window 154 with the contact plug 185 by the PVD method, which will lead to a broken circuit between the third conducting layer 144 and the source/drain region 111 in the peripheral circuit area 104.

The above-described defects occur in the prior process are the most part of resulting in losing the expected function and decreasing the yield of the semiconductor product.

SUMMARY OF THE INVENTION

It is therefore a primary objective of the present invention to provide a method of forming a crown-shaped capacitor and contact plugs to improve the shortcomings occurring in the prior art.

In a preferred embodiment, the present invention provides a method of forming a capacitor and contact plugs on an active area of a semiconductor substrate. Firstly, provides the semiconductor substrate that comprises a first source/drain region in a first area and a second source/drain region in a second area. A first insulating layer covers the first source/drain region and the second source/drain region. A first contact plug penetrates the first insulating layer in the second area, and a second contact plug penetrates the first insulating layer in the first area. A second insulating layer is positioned on the first insulating layer. Then, a first shielding layer is formed on the second insulating layer, wherein the first shielding layer comprises a first opening positioned right above the second contact plug and a second opening positioned right above the first contact plug. Next, a second shielding layer is formed to fill the first opening and remain on the sidewall of the second opening as a spacer. Next, a third opening is formed to pass through the second opening, the second insulating layer and part of the first insulating layer till exposing the top of the first contact plug. Then, a first barrier layer is formed on the sidewall and bottom of the third opening followed by forming a second conducting layer to fill the third opening so as to connect the first contact plug. Next, a fourth opening is formed to pass through the first opening till exposing the top of the second contact plug. Next, a third conducting layer is formed on the sidewall and bottom of the fourth opening. Then, the second insulating layer positioned in the first area is removed to expose the third conducting layer that is used as a bottom electrode plate of the capacitor. Afterward, a dielectric layer is formed on the bottom electrode plate, the first insulating layer and the second insulating layer positioned in the first area and then a fourth conducting layer is formed on the dielectric layer to be an upper electrode plate of the capacitor. Then, a third insulating layer is formed which comprises a fifth opening positioned on the upper electrode plate in the first area and a sixth opening positioned on the third contact plug in the second area. Next, a second barrier layer is formed on the sidewall and bottom of the fifth opening and the sixth opening. Finally, a fifth conducting layer is formed on the second barrier layer to fill the fifth opening and the sixth opening. The fifth conducting layer in the fifth opening is a fourth contact plug and the fifth conducting layer in the sixth opening is a fifth contact plug.

It is an advantage of the present invention that the method divides the formation of the contact plug connecting the source/drain region in the peripheral circuit area into two steps, wherein the capacitor can be fabricated at the same time so as to save one mask. Consequently, the simplified process can reduce the manufacturing period time and the production cost. Besides, at each step of forming the contact plug with low aspect ratio, a CVD method is utilized to uniformly deposited a barrier layer on the contact window and completely fill the contact window. This can thoroughly eliminate the defects found in the prior art.

This and other objective of the present invention will no doubt become obvious to those of ordinary skill in the art after having read the following detailed description of the preferred embodiment, which is illustrated in the various figures and drawings.

BRIEF DESCRIPTION OF THE DRAWINGS

The present invention will be understood more fully from the detailed description given here below and from the accompany drawings of the preferred embodiment of the invention.

In the drawing.

DETAILED DESCRIPTION OF THE PREFERRED EMBODIMENT

Figure 1A:
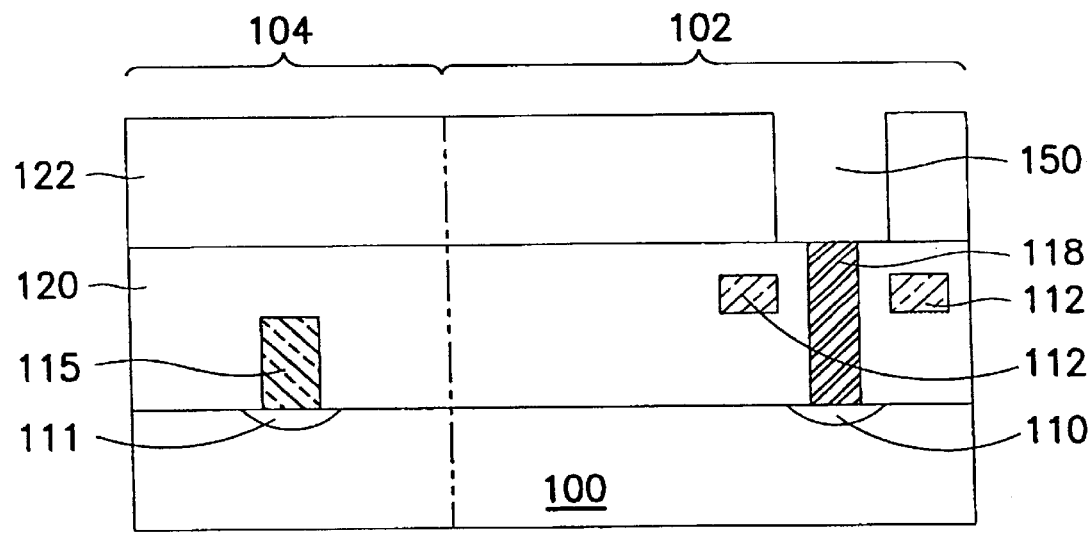
FIG. 1A to FIG. 1G are schematic cross-sectional diagrams of forming a crown-shaped capacitor and a contact plug according to the prior art.
Figure 1B:
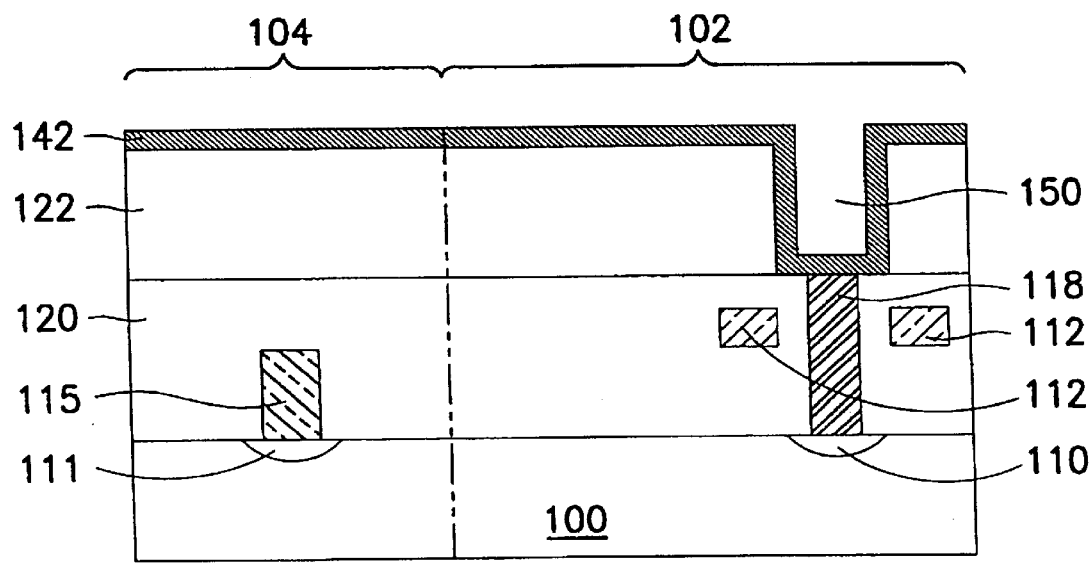
Figure 1C:
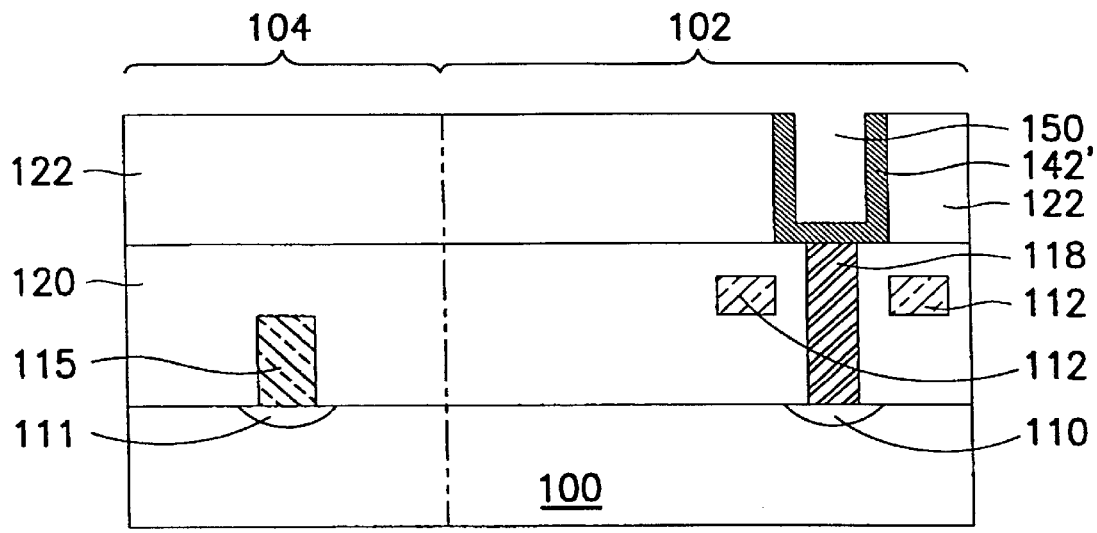
Figure 1D:
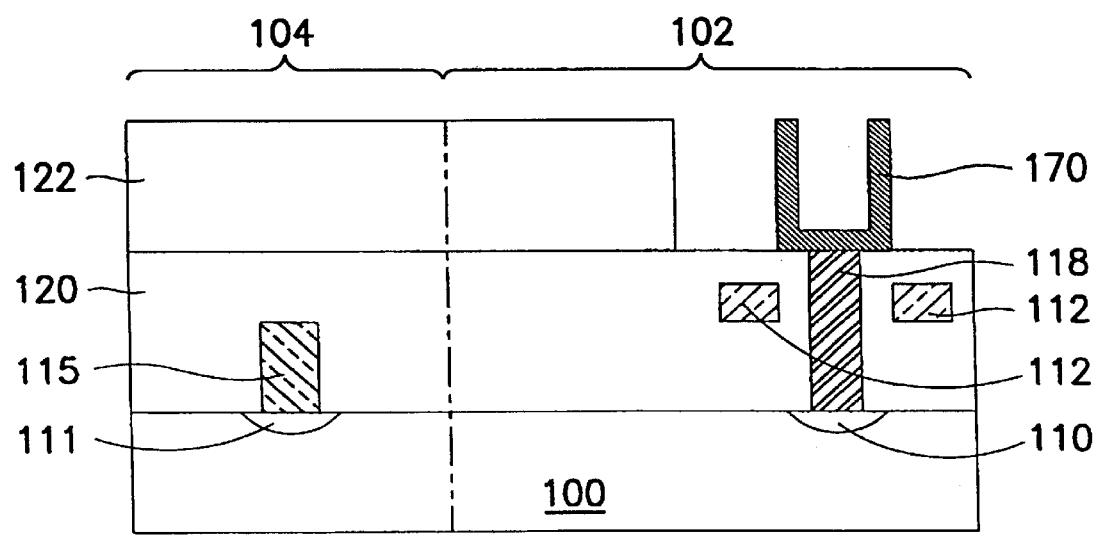
Figure 1E:
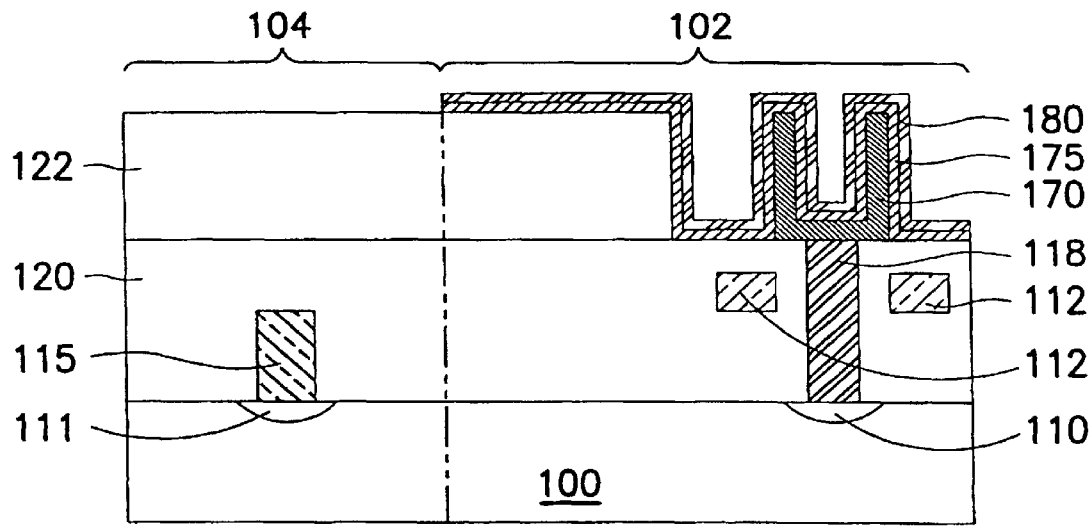
Figure 1F:
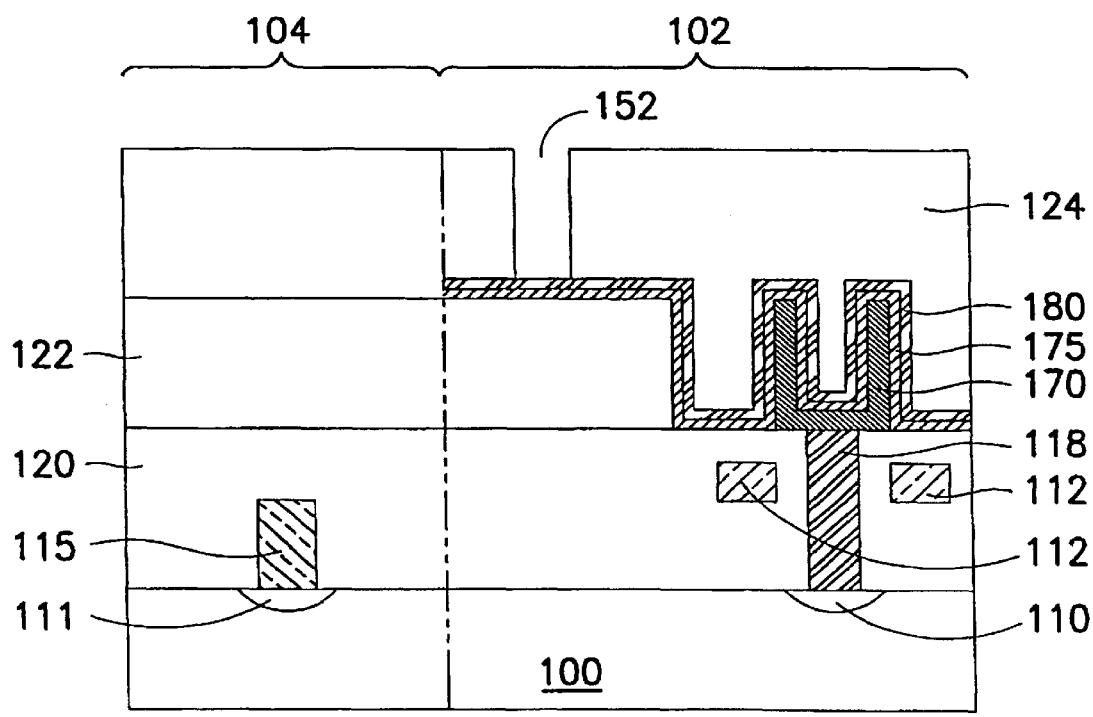
Figure 1G:
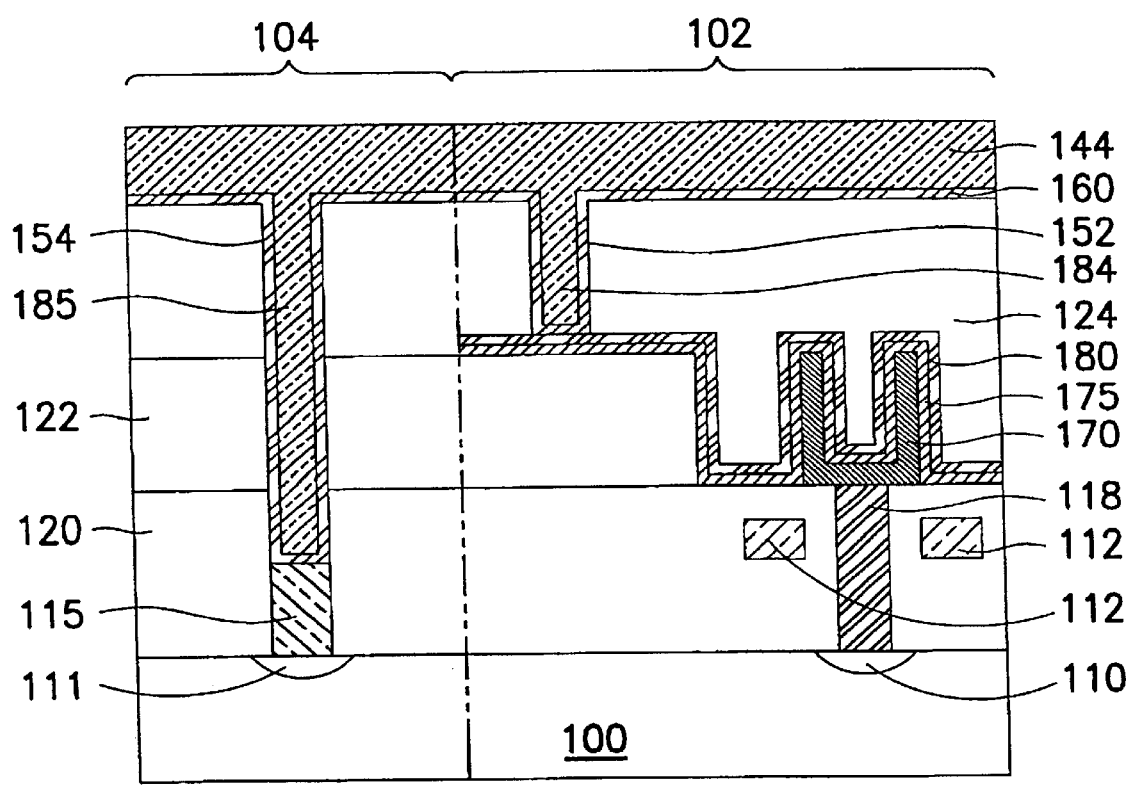
Figure 2A:
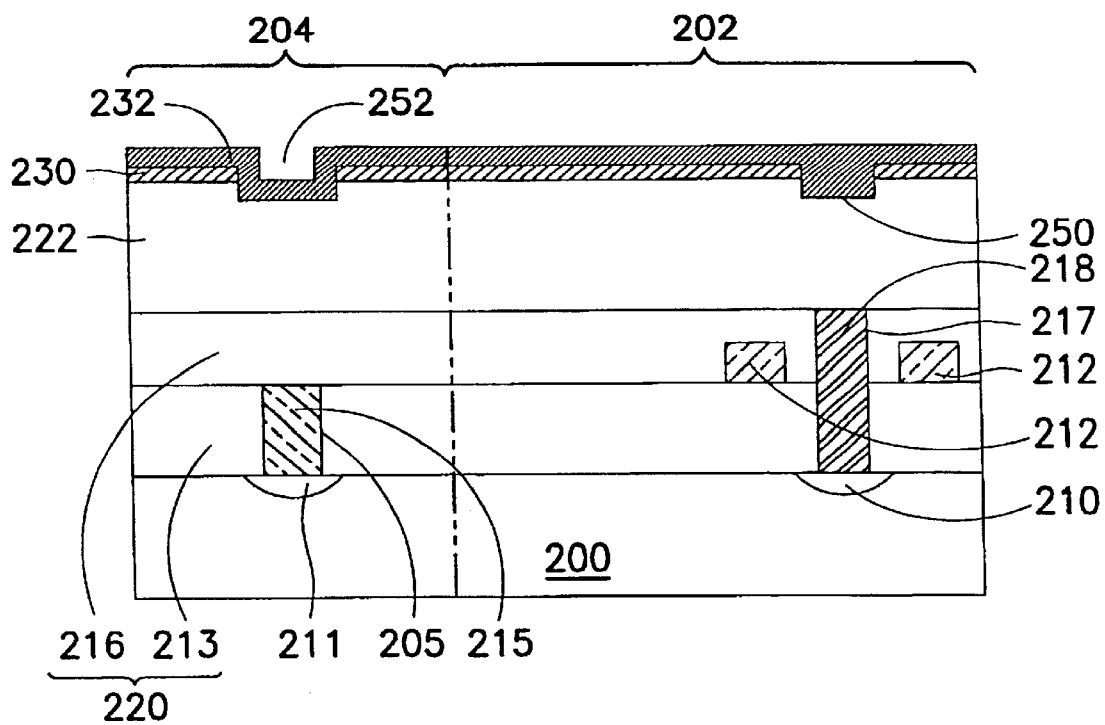
FIG. 2A to FIG. 2K are schematic cross-sectional diagrams of forming a capacitor and a contact plug according to the present invention.

Please refer to FIG. 2A to FIG. 2K, FIG. 2A to FIG. 2K are schematic cross-sectional diagrams of forming a capacitor and a contact plug according to the present invention. As shown in FIG. 2A, a substrate 200 formed of a semiconductor material such as silicon or germanium by epitaxy method or silicon on insulator (SOI) method is provided. In the preferred embodiment, the substrate 200 is represented as a p-type silicon substrate. Firstly, a shallow trench isolation (STI) process is performed on the p-type silicon substrate 200 to isolate an active area represented as a first area 202 and second area 204. The first area 202 is used as a memory cell area, and the second area 204 is used as a peripheral circuit area. Next, semiconductor processes such as deposition, photolithography and ion-implantation are performed to form a transistor (not shown) that comprising a gate and a diffusion region. The gate is formed of a doped polysilicon layer and a silicide layer. The diffusion region comprises a first source/drain region 210 in the first area 202 and a second source/drain region 211 in the second area 204. Then, an insulating layer 213 made of BPSG, non-doped silicon glass (NSG), HDP Oxide or TEOS is formed by CVD, APCVD, SAPCVD, LPCVD, PECVD, or HDPCVD and followed by a planarization process. Next, a photolithography is used to pattern and form a first contact window 205 that passes through the insulating layer 213 till exposing the top of the second source/drain region 211 by an anisotropy etching process. Next, a conducting layer 206 made of tungsten is filled in the first contact window 205 to be a first contact plug 215 for connecting the second source/drain region 211, wherein the conducting layer 206 deposited on the surface of the insulating layer 213 is then removed.

Next, according to the semiconductor process shown in prior art, a bit line 212 made of tungsten is formed in the first area 202 for connecting other memory cells.

Next, another insulating layer 216 made of BPSG, NSG, HDP Oxide or TEOS with a thickness of 1000~6000 Å is formed by CVD, APCVD, SAPCVD, LPCVD, PECVD, or HDPCVD. Hereinafter, the insulating layers 213,216 are combined to be a first insulating layer 220. The first insulating layer 220 can isolate the sequentially formed bit line 212 and bottom electrode plate. Next, a second contact window 217 is formed to pass through the first insulating layer 220 till exposing the first source/drain region 210 by a photolithography and an anisotropy etching process. Then, a first conducting layer with a thickness of 1000~5000 Å is deposited by a LPCVD method to fill the second contact window 217. The first conducting layer is made of As-ion or P-ion doped polysilicon by diffusion, ion-implantation or synchronous implantation and followed by an etching back process. The first conducting layer only remaining in the second contact window 217 is used as a second contact plug 218. Next, a second insulating layer 222 made of BPSG, NSG, HDP Oxide or TEOS with a thickness of 3000~20000 Å is deposited on the first insulating layer 220 by CVD, APCVD, SAPCVD, LPCVD, PECVD, or HDPCVD. Then, a first shielding layer 230 made by polysilicon with a thickness of 100~3000 Å is deposited on the second insulating layer 222 by a LPCVD method.

The key steps of the present invention are described hereinafter. After a photolithography process, part of the first shielding layer 230 and the second insulating layer 222 are etched to form a first opening 250 positioned right above the second contact plug 218 in the first area 202 and a second opening 252 positioned right above the first contact plug 215 in the second area 204. Both the first opening 250 and the second opening do not penetrate the second insulating layer 222. The diameter of the first opening 250 (about 0.1~0.3um) must be smaller than that of the second opening 252 (about 1.5~2.5 times the diameter of the first opening). Next, a second shielding layer 232 made of silicon nitride with a thickness of 500~3000 Å is deposited on the first shielding layer 230 by a LPCVD method. Since the diameter of the first opening 250 is smaller than that of the second opening 252, the second shielding layer 232 only fills the first opening 250 and extends to the sidewall and bottom of the second opening 252.

Figure 2B:
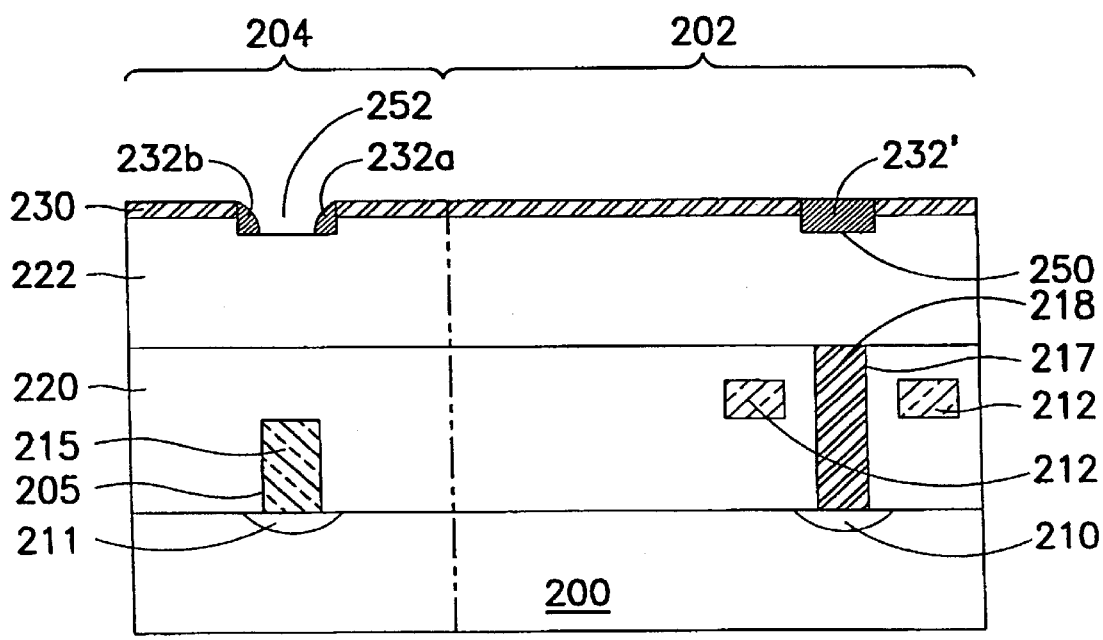

As shown in FIG. 2B, an anisotropy etching back process is used to remove the second shielding layer 232 positioned on the first shielding layer 230, and remain the second shielding layer 232' filled in the first opening 250 and those positioned on the sidewall of the second opening 252. The remaining second shielding layer 232' positioned on each sidewall of the second opening 252 respectively forms a first spacer 232a and a second spacer 232b.

Figure 2C:
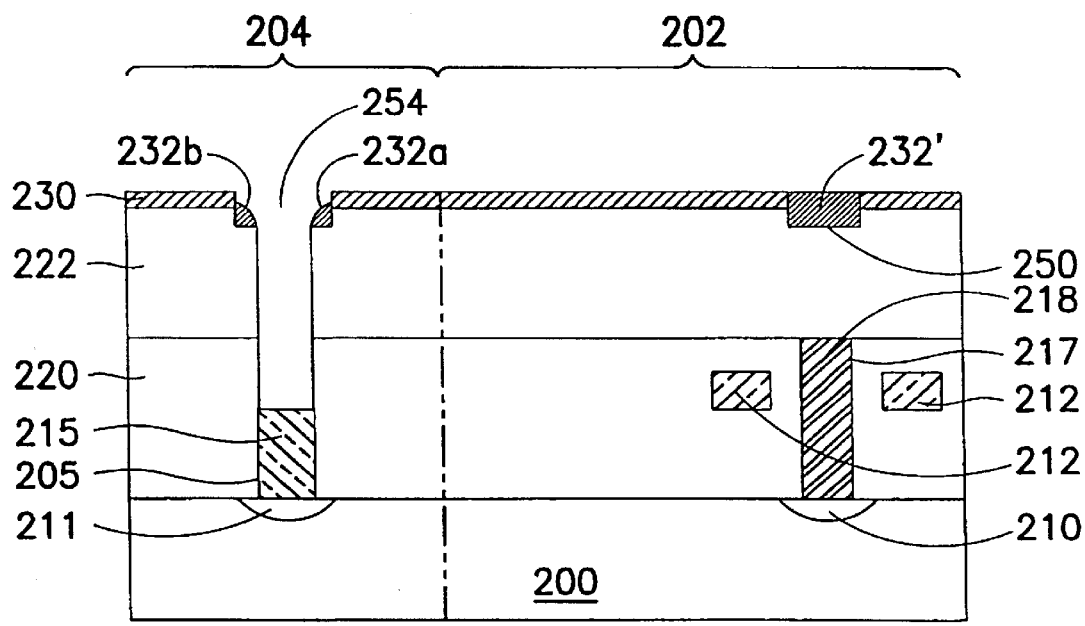

As shown in FIG. 2C, by using the first shielding layer 230 and the remaining second shielding layer 232' as a mask, an anisotropy etching process is performed on the second opening 252 to form a third opening 254 penetrating the second insulating layer 222 and the first insulating layer 220 till exposing the top of the first contact plug 215. As to the first opening 250 filled with the remaining second shielding layer 232', it is masked without etching for sequential formation of a bottom electrode plate.

Figure 2D:
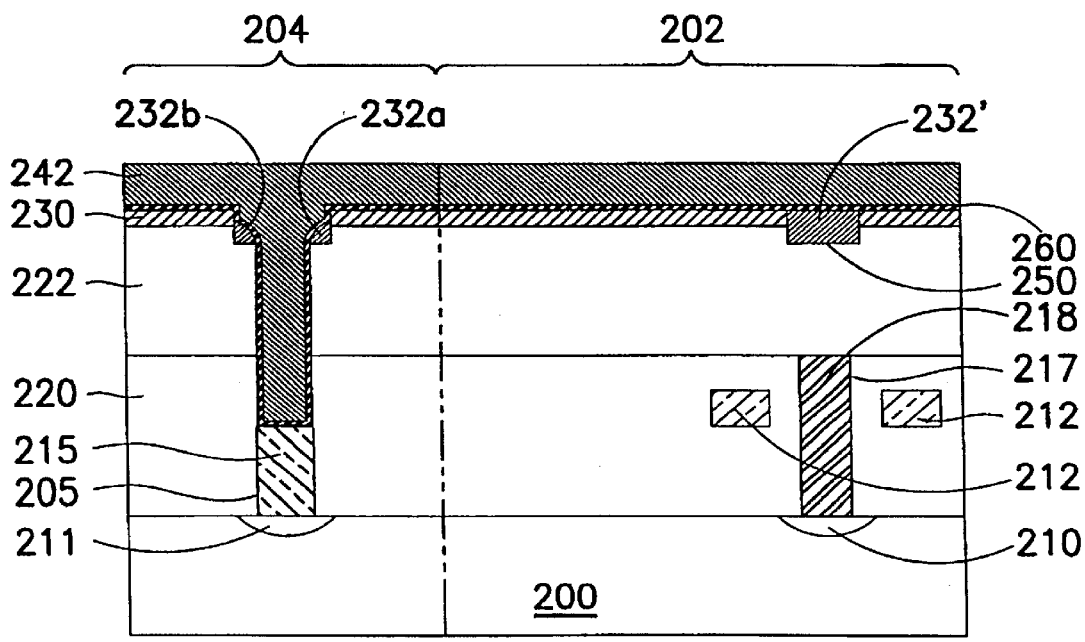

As shown in FIG. 2D, a first barrier layer 260 is deposited on the first shielding layer 230 by a CVD method to cover the sidewall and bottom of the third opening 254 and the surface of the spacers 232a, 232b. The first barrier layer 260 comprises a titanium layer with a thickness of 500~1500 Å and a titanium nitride layer with a thickness of 200~500 Å. Then, a second conducting layer 242 made of tungsten with a thickness of 1000~6000 Å is deposited by a CVD method to fill the third opening 254 and connect to the first contact plug 215.

Figure 2E:
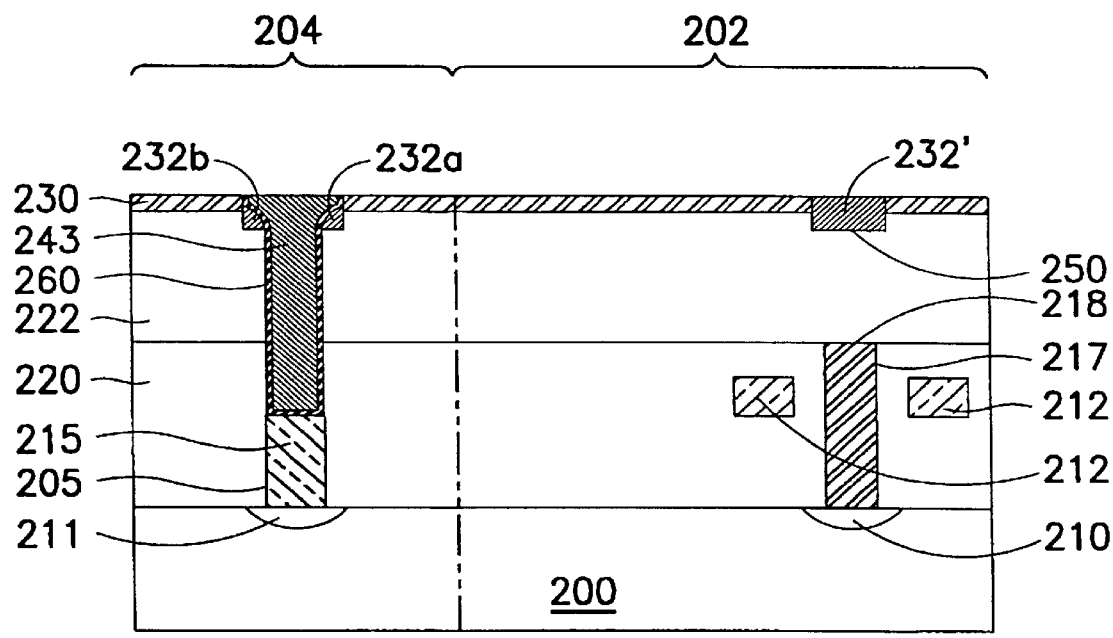

As shown in FIG. 2E, by using the first shielding layer 260 as a stop layer, a CMP process is performed to remove the surfaces of the second conducting layer 242 and the first shielding layer 260 and only remain the second conducting layer 242 in the third opening 254 to be a third contact plug 243 for connecting to the first contact plug 215.

Figure 2F:
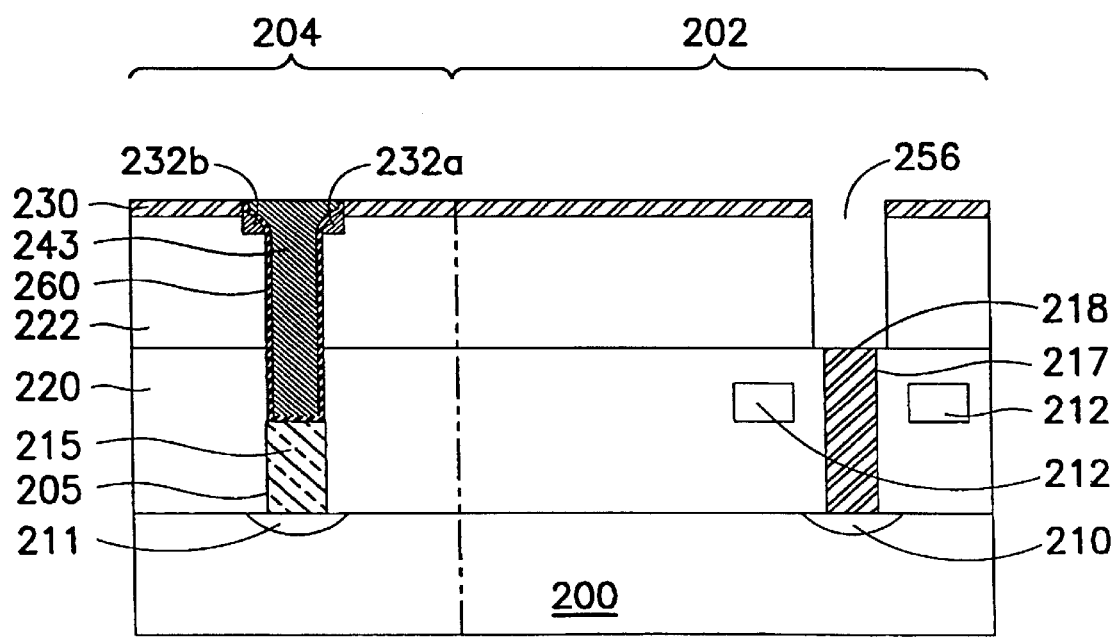

As shown in FIG. 2F, by using the first shielding layer 230 as a mask, the remaining second shielding layer 232' in the first opening 250 and the second insulating layer 222 right below the first opening 250 are etched away to form a fourth opening 256 till exposing the top of the second contact plug 218.

Figure 2G:
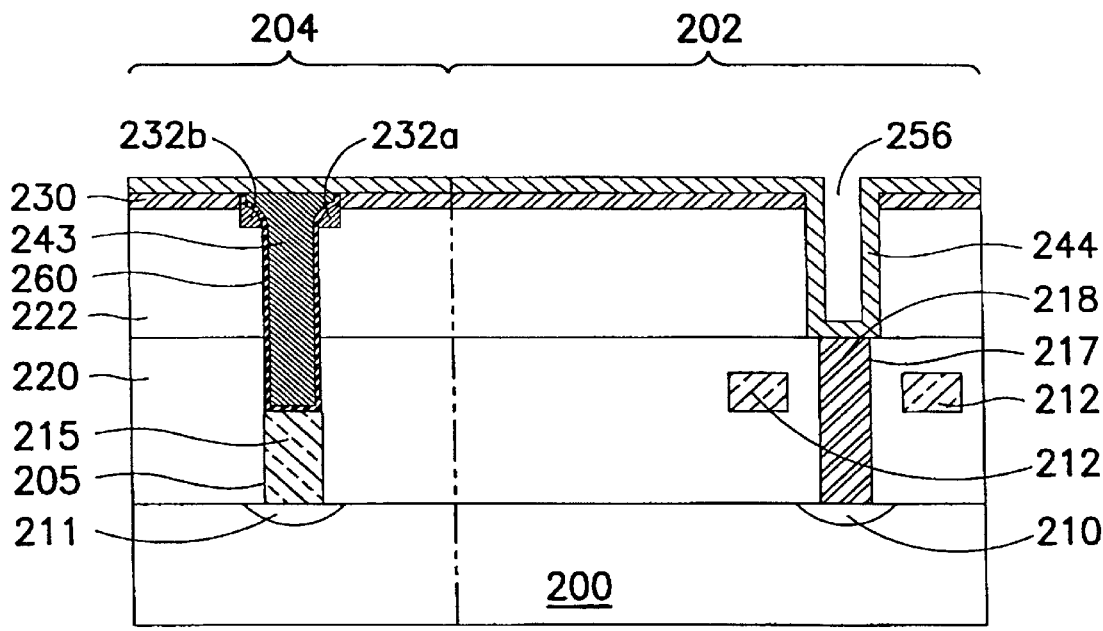

As shown in FIG. 2G, a third conducting layer 244 with a thickness of 100~3000 Å is deposited by LPCVD method on the first shielding layer 230 and extends to the sidewall and bottom of the fourth opening 256. The third conducting layer 244 is made of As-ion or P-ion doped polysilicon by diffusion, ion-implantation or synchronous implantation. Concerning a SAPCVD (or called Tungsten CVD) used in the prior art, the bad step coverage makes the tungsten layer sealed or even makes air trapped to form a void in the narrow opening of the capacitor with high aspect ration (greater than 10:1). That is unable to deposit the dielectric layer inside the capacitor and thus loses the expected performance. In order to improve the shortcomings occurring in the prior art, this step uses the LPCVD method with better step coverage to substitute a SAPCVD (or called Tungsten CVD). This can ensure that the inside space of the capacitor is sufficiently utilized and is not full of the bottom electrode plate. Hence, the present invention will not decrease the surface area and capacitance of the capacitor to keep the semiconductor device regularly operating.

Figure 2H:
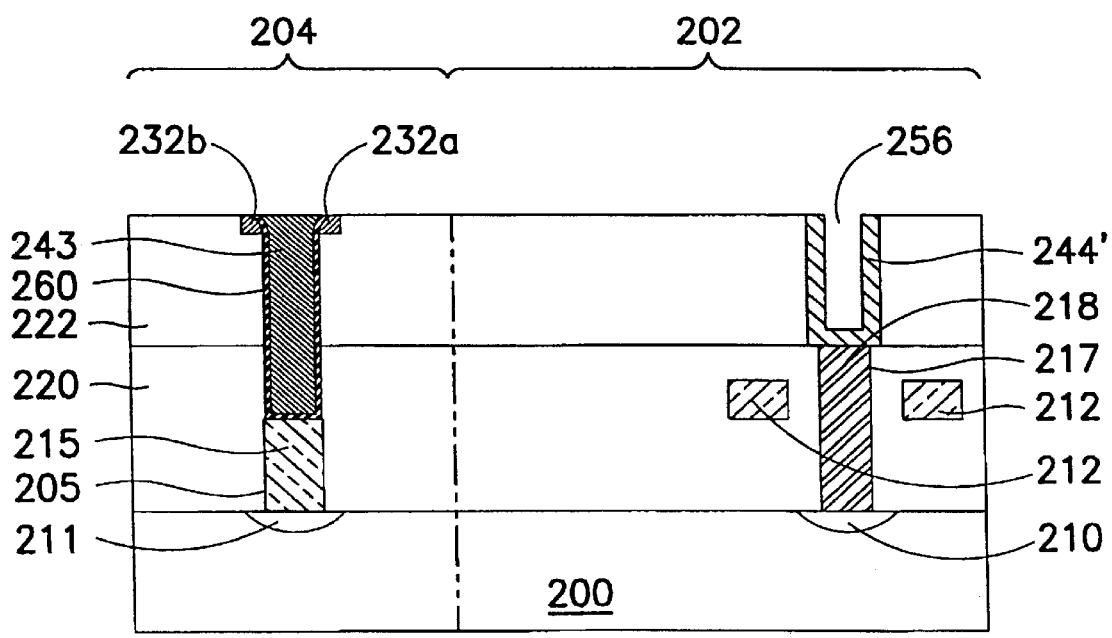

As shown in FIG. 2H, a photoresist layer 245 (not shown) is coated on the third conducting layer 244 and fills the fourth opening 256. Then, a CMP process is used to remove the photoresist layer, the third conducting layer 244 and the first shielding layer 230 positioned above the second insulating layer 222. This step remains the third conducting layer 244' and the photoresist layer 245' filled in the fourth opening 256. The remaining photoresist layer 245' is used to prevent the interior of the fourth opening 256 being contaminated from the micro-particles formed in the CMP process and thereby ensure the function of the semiconductor device. By the way, though part of the spacer 232a, 232b and the top portion of the third contact plug 243 in the second opening 252 is removed, it will not influence the whole structure and function of the device. Afterward, the remaining photoresist layer 245' is removed.

Figure 2I:
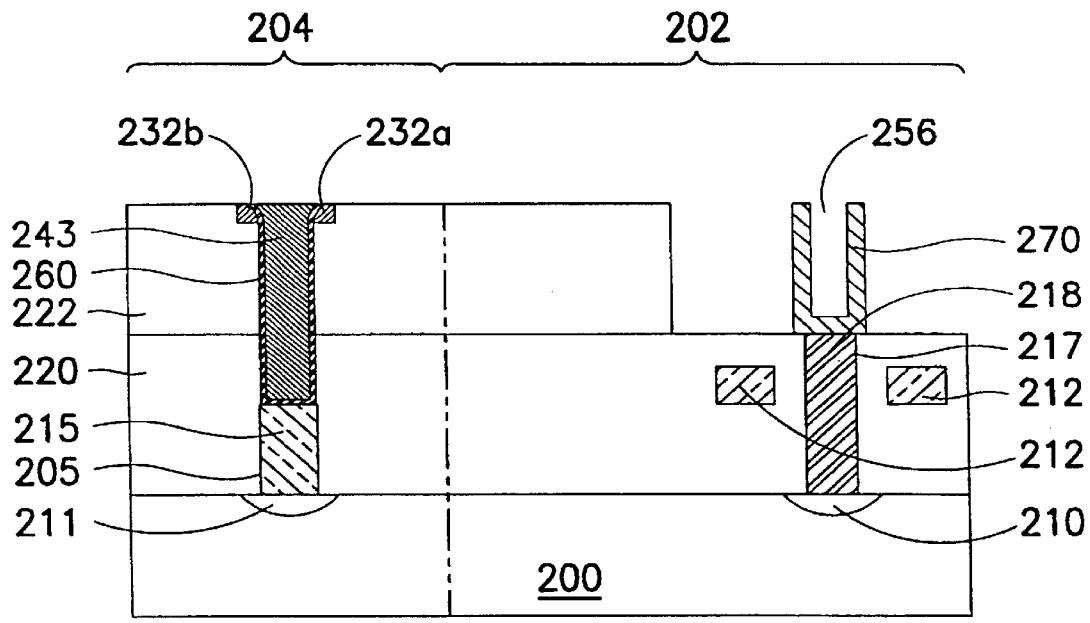

As shown in FIG. 2I, by a photolithography, part of the second insulating layer 222 in the first area 202 is etched away to expose the remaining third conducting layer 244 that is used as a bottom electrode plate 270 of the crown-shaped capacitor. Further, a hemi-spherical glass process can be performed on the bottom electrode plate 270 to form rising grains that may increase the area of the bottom electrode plate 270 so as to greatly enhance the capacitance. Compared with the present invention, the bottom electrode plate in the prior art is made of tungsten and therefore the hemispherical glass process cannot apply to.

Figure 2J:
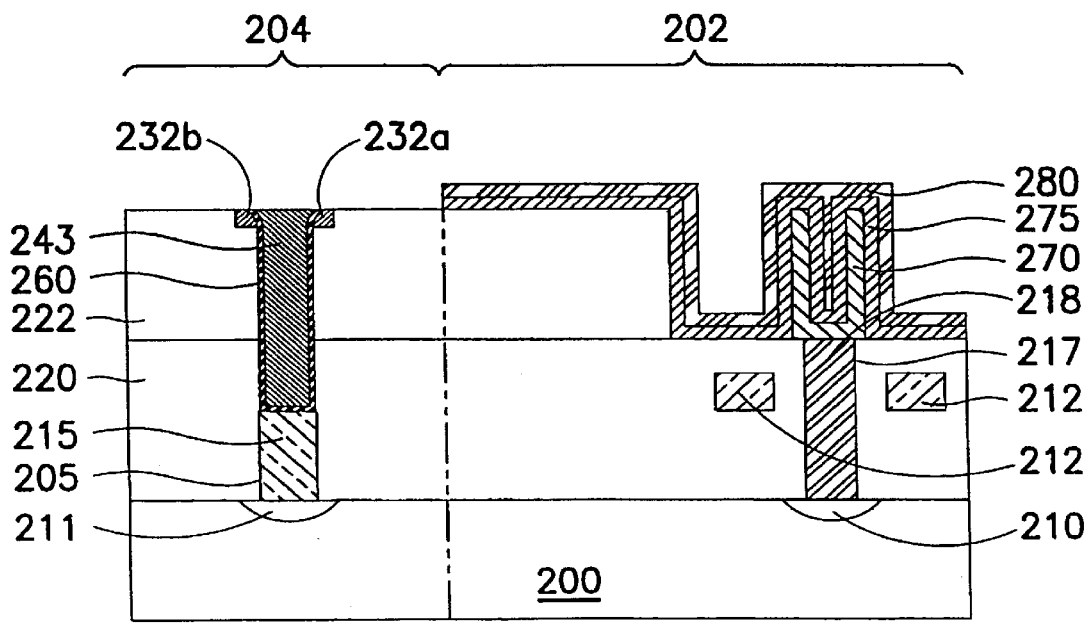

As shown in FIG. 2J, a dielectric layer 275 and a fourth conducting layer 280 are sequentially formed on the surface of the substrate 200. As to the formation of the dielectric layer 275, one way is that a silicon oxide layer is firstly deposited and then a nitride layer is formed by nitriding and another silicon nitride layer is finally deposited. Another way is that only one insulating layer of high dielectric constant such as tantalum oxide is deposited. As to the formation of the fourth conducting layer 280, a LPCVD method is used to deposit a polysilicon layer that is further doped by As-ion or P-ion. Next, the dielectric layer 275 and the fourth conducting layer 280 positioned in the second area 204 are removed. The fourth conducting layer 280 remaining in the first area 202 is used as an upper electrode plate 280.

Figure 2K:
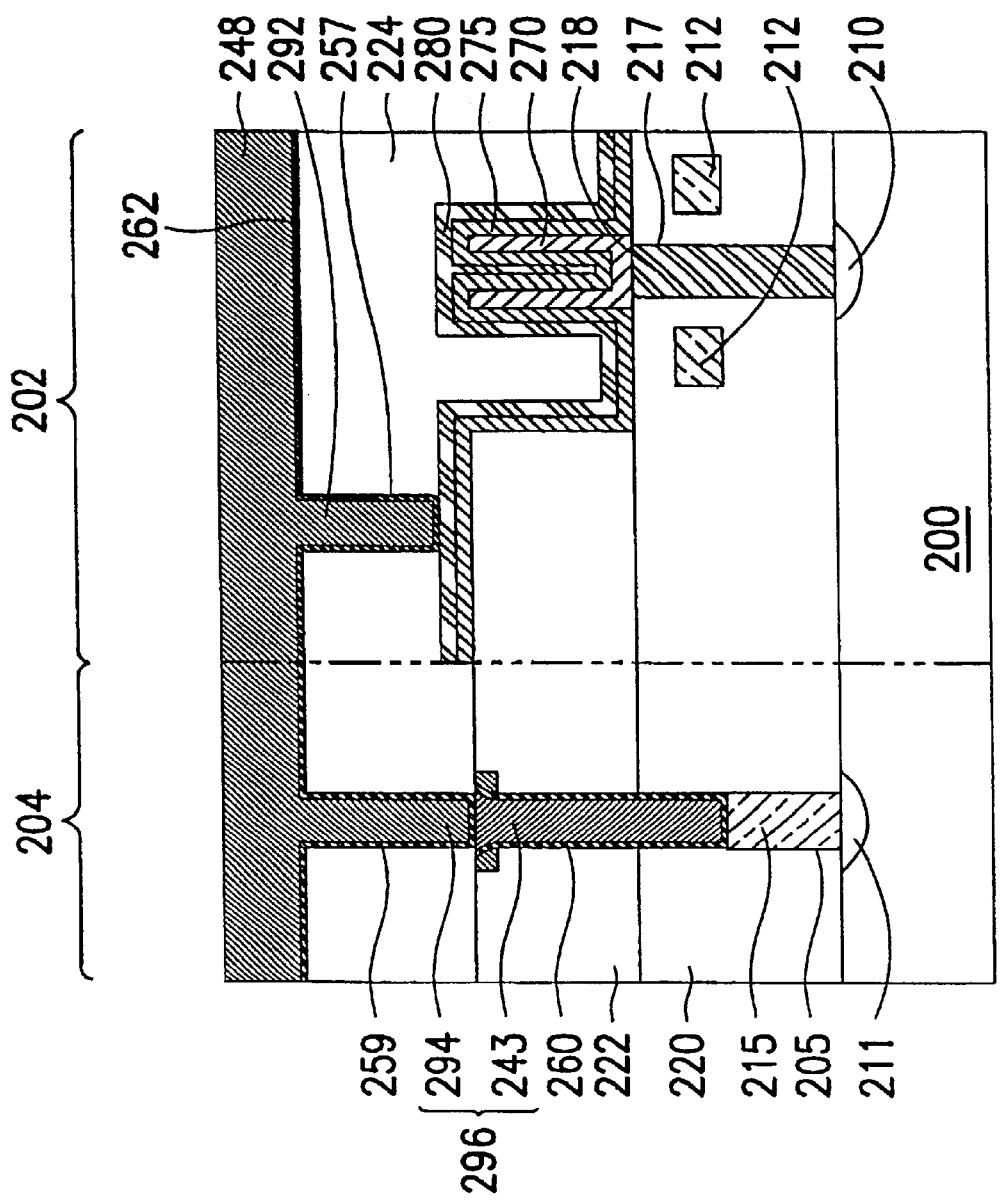

As shown in FIG. 2K, a third insulating layer 224 made of BPSG, NSG, HDP oxide or TEOS with a thickness of 3000~30000 Å is deposited on the surface of the substrate 200 by CVD, APCVD, SAPCVD, LPCVD, PECVD OR HDPCVD. After a planarization process, a fifth opening 257 penetrating the third insulating layer 224 to expose the top of the upper electrode plate 280 is formed in the first area 202. At the same time, a sixth opening 259 penetrating the third insulating layer 224 to expose the top of the third contact plug 243 is formed in the second area 204.

Next, a second barrier layer 262 is deposited by CVD method on the third insulating layer 224 and extends to the sidewall and bottom of the fifth opening 257 and the sixth opening 259. The second barrier layer 262 comprises a titanium layer of 500~1500 Å thickness and a titanium nitride layer of 200~500 Å thickness. Finally, a fifth conducting layer 248 made of tungsten with a thickness of 1000~6000 Å is deposited on the second barrier layer 262 to fill the fifth opening 257 and the sixth opening 259 and respectively form a fourth contact plug 292 and a fifth contact plug 294. The third contact plug and the fifth contact plug 294 are combined to represented as a contact plug 296. In the second area 204, the fifth conducting layer 248 can connects the second source/drain region 211 through the contact plug 296 and the first contact plug 215. In the first area 202, the fifth conducting layer 248 can connect the upper electrode plate 280 through the fourth contact plug 292.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a capacitor and contact plugs on an active area of a semiconductor substrate, comprising the steps:

(a) providing the semiconductor substrate comprising a first source/drain region in a first area, a second source/drain region in a second area, a first insulating layer covering the first source/drain region and the second source/drain region, a first contact plug penetrating the first insulating layer in the second area, a second contact plug penetrating the first insulating layer in the first area, and a second insulating layer positioned on the first insulating layer;

(b) forming a first shielding layer on the second insulating layer, the first shielding layer comprising a first opening positioned right above the second contact plug and a second opening positioned right above the first contact plug;

(c) forming a second shielding layer to fill the first opening and remain on the sidewall of the second opening as a spacer;

(d) forming a third opening passing through the second opening, the second insulating layer and part of the first insulating layer till exposing the top of the first contact plug;

(e) forming a first barrier layer on the sidewall and bottom of the third opening and forming a second conducting layer to fill the third opening and thereby connect the first contact plug;

(f) forming a fourth opening passing through the first opening till exposing the top of the second contact plug;

(g) forming a third conducting layer on the sidewall and bottom of the fourth opening;

(h) removing part of the second insulating layer positioned in the first area to expose the third conducting layer that is used as a bottom electrode plate of the capacitor;

(i) forming a dielectric layer on the bottom electrode plate, the first insulating layer and the second insulating layer positioned in the first area and then forming a fourth conducting layer on the dielectric layer to be an upper electrode plate of the capacitor;

(j) forming a third insulating layer which comprises a fifth opening positioned on the upper electrode plate in the first area and a sixth opening positioned on the third contact plug in the second area;

(k) forming a second barrier layer on the sidewall and bottom of the fifth opening and the sixth opening; and (l) forming a fifth conducting layer on the second barrier layer to fill the fifth opening and the sixth opening, wherein the fifth conducting layer in the fifth opening is a fourth contact plug and the fifth conducting layer in the sixth opening is a fifth contact plug.

2. The method of claim 1, wherein the semiconductor substrate is a silicon substrate.

3. The method of claim 1, wherein the diameter of the first opening is smaller that the diameter of the second opening.

4. The method of claim 3, wherein the diameter of the second opening is 1.5~2.5 times the diameter of the first opening.

5. The method of claim 1, wherein the formation of the second contact plug comprises the steps:

(a) forming a contact window passing through the first insulating layer till exposing the first source/drain region in the first area;

(b) forming a first conducting layer to fill the contact window; and (c) removing the first conducting layer positioned on the first insulating layer, the remaining first conducting layer in the contact window is the second contact plug.

6. The method of claim 5, wherein the first conducting layer is made of doped polysilicon.

7. The method of claim 5, wherein the thickness of the first conducting layer is 1000~5000 Å.

8. The method of claim 1, wherein the second conducting layer is made of tungsten.

9. The method of claim 1, wherein the thickness of the second conducting layer is 1000~6000 Å.

10. The method of claim 1, wherein the formation of the bottom electrode plate comprises the steps:

(a) forming the third conducting layer on the sidewall and bottom of the fourth opening;

(b) using a photolithography process to pattern the second insulating layer; and (c) etching part of the second insulating layer positioned in the first area to expose the third conducting layer.

11. The method of claim 10, wherein the third conducting layer is made of doped polysilicon.

12. The method of claim 10, wherein the third conducting layer is formed by a LPCVD method.

13. The method of claim 10, wherein the thickness of the third conducting layer is 100~3000 Å.

14. The method of claim 1, wherein the thickness of the fifth conducting layer is 1000~6000 Å.

15. The method of claim 1, wherein the first shielding layer is made of polysilicon.

16. The method of claim 1, wherein the thickness of the first shielding layer is 100~3000 Å.

17. The method of claim 1, wherein the second shielding layer is made of silicon nitride.

18. The method of claim 1, wherein the thickness of the second shielding layer is 500~3000 Å.

19. The method of claim 1, wherein the thickness of the second insulating layer is 3000~20000 Å.

20. The method of claim 1, wherein the thickness of the third insulating layer is 3000~30000 Å.

21. The method of claim 1, wherein the capacitor is a crown-shaped capacitor.

22. The method of claim 1, wherein the semiconductor substrate further comprises a bit line positioned in the first insulating layer.

* * * * *